(12) United States Patent
Kaida

(10) Patent No.: US 7,880,259 B2
(45) Date of Patent: Feb. 1, 2011

(54) SOLID-STATE IMAGE SENSOR

(75) Inventor: Takayuki Kaida, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 281 days.

(21) Appl. No.: 11/203,131

(22) Filed: Aug. 15, 2005

(65) Prior Publication Data

US 2006/0049431 A1    Mar. 9, 2006

(30) Foreign Application Priority Data

Sep. 7, 2004   (JP)   ............... 2004-259130
Jul. 8, 2005   (JP)   ............... 2005-199733

(51) Int. Cl.
*H01L 27/148*    (2006.01)
(52) U.S. Cl. .................. 257/465; 257/222; 257/232
(58) Field of Classification Search ........... 257/222, 257/465, 232
See application file for complete search history.

(56) References Cited

U.S. PATENT DOCUMENTS 4,580,168 A * 4/1986 Levine .................... 348/244
4,965,872 A * 10/1990 Vasudev .................. 257/526

FOREIGN PATENT DOCUMENTS

| JP | 57-058358 | 4/1982 |
| JP | 05-291550 | 11/1993 |
| JP | 06-169076 | 6/1994 |
| JP | 07-074345 | 3/1995 |
| JP | 3263197 | 12/2001 |

OTHER PUBLICATIONS

Ando, Takao., et al. "The Basis of Solid-State Imaging Devices." Nihon Riko Shuppan-Kai, Dec. 5, 1999, pp. 80-81.
Japanese Notification of Reason(s) for Rejection, w/ English translation thereof, issued in Japanese Patent Application No. JP 2005-199733 dated Nov. 24, 2009.

* cited by examiner

*Primary Examiner*—Michael B Shingleton
(74) *Attorney, Agent, or Firm*—McDermott Will & Emery LLP

(57) ABSTRACT

A solid-state image sensor capable of improving detection sensitivity for an output signal is provided. This solid-state image sensor comprises a first gate electrode formed on a semiconductor substrate, a first impurity region formed on the semiconductor substrate at a first distance from the first gate electrode for receiving the signal charges and a second gate electrode formed at a second distance from the first impurity region for discharging unnecessary signal charges after extraction of a voltage signal from the first impurity region. The first distance between the first impurity region and the first gate electrode is larger than the second distance between the first impurity region and the second gate electrode.

19 Claims, 12 Drawing Sheets

SOLID-STATE IMAGE SENSOR

BACKGROUND OF THE INVENTION

1. Field of the Invention

The present invention relates to a solid-state image sensor, and more particularly, it relates to a solid-state image sensor comprising an impurity region receiving signal charges and extracting voltage signal.

2. Description of the Background Art

A solid-state image sensor comprising an impurity region receiving signal charges and extracting voltage signal is known in general, as disclosed in Japanese Patent No. 3263197, for example.

FIG. 24 is a sectional view showing the structure of an exemplary conventional solid-state image sensor structurally similar to that disclosed in the aforementioned Japanese Patent No. 3263197. FIG. 25 is a potential diagram of the exemplary conventional solid-state image sensor shown in FIG. 24. Referring to FIG. 24, the exemplary conventional solid-state image sensor comprises an n-type silicon substrate 101. A p-type well region 102 is formed up to a prescribed depth from the upper surface of the n-type silicon substrate 101. An $N^-$-type transfer channel region 103 is formed on the surface of the p-type well region 102 for storing and transferring signal charges. A plurality of stages of transfer gate electrodes 105 and an output gate electrode 106 are formed on the transfer channel region 103 at a prescribed distance through a gate insulating film 104. The plurality of stages of transfer gate electrodes 105 are constituted of first- and second-layer transfer gate electrodes 105a and 105b respectively.

The first- and second-layer transfer gate electrodes 105a and 105b are provided adjacently to each other through insulating films 107 respectively. The output gate electrode 106 is provided adjacently to the final-stage first-layer transfer gate electrode 105a through a corresponding insulating film 107. The solid-state image sensor alternately applies two-phase clock pulse signals ΦH1 and ΦH2 to the respective transfer gate electrodes 105, as shown in FIG. 25. The solid-state image sensor is so formed as to transfer signal charges stored in the transfer channel region 103 to the region located under the output gate electrode 106 by vertically moving channel potentials in potential wells formed in portions of the transfer channel region 103 located under the transfer gate electrodes 105 respectively with the two-phase clock pulse signals ΦH1 and ΦH2. The solid-state image sensor applies a prescribed DC voltage $V_{OG}$ to the output gate electrode 106 for holding the output gate electrode 106 in an ON-state.

An $N^{++}$-type floating diffusion region 108 is formed on the p-type well region 102 of the n-type silicon substrate 101 continuously with the transfer channel region 103, as shown in FIG. 24. This floating diffusion region 108 is formed to receive and store the signal charges output from the transfer channel region 103. An $N^{++}$-type drain region 109 is formed on the p-type well region 102 of the n-type silicon substrate 101 to hold an $N^-$-type channel region 110 between the same and the floating diffusion region 108. A reset gate electrode 111 is formed on the channel region 110 through the gate insulating film 104. The solid-state image sensor inputs a reset pulse signal ΦR in this reset gate electrode 111, for switching the reset gate electrode 111 between ON- and OFF-states. The floating diffusion region 108, the drain region 109, the channel region 110, the gate insulating film 104 and the reset gate electrode 111 constitute a rest MOS transistor for discharging unnecessary signal charges after extraction of a voltage signal $V_{out}$ from the floating diffusion region 108. In other words, the solid-state image sensor is so formed as to discharge unnecessary signal charges from the floating diffusion region 108 to the drain region 109 through the channel region 110 located under the ON-state reset gate electrode 111 by inputting the reset pulse signal ΦR into the reset gate electrode 111 for bringing the same into the ON-state after extracting the voltage signal $V_{out}$ from the floating diffusion region 108.

The floating diffusion region 108 is formed at a prescribed distance L from the output gate electrode 106. Thus, the capacitance between the floating diffusion region 108 and the output gate electrode 106 is reduced. An interlayer dielectric film 112 is formed to cover the second-layer transfer gate electrodes 105b, the insulating films 107, the output gate electrode 106, the reset gate electrode 111 and the gate insulating film 104. A contact hole 112a reaching the surface of the floating diffusion region 108 is formed in regions of the interlayer dielectric film 112 and the gate insulating film 104 corresponding to the floating diffusion region 108 respectively. A wiring layer 113 is formed to fill up the contact hole 112a while extending on the interlayer dielectric film 112. The wiring layer 113 is connected to a source-follower output amplifying circuit 114 (see FIG. 25). This source-follower output amplifying circuit 114 is provided for extracting the signal charges stored in the floating diffusion region 108 through the wiring layer 113 while amplifying the extracted signal charges and converting the same to the voltage signal $V_{out}$. The output amplifying circuit 114 outputs the converted voltage signal $V_{out}$.

The voltage of the signal extracted from the floating diffusion region 108 to the output amplifying circuit 114 varies with the total capacitance $C_{fd}$ of the floating diffusion region 108. In other words, the voltage of the signal extracted from the floating diffusion region 108 to the output amplifying circuit 114 is reduced as the total capacitance $C_{fd}$ of the floating diffusion region 108 is increased. On the other hand, the voltage of the signal extracted from the floating diffusion region 108 to the output amplifying circuit 114 is increased as the total capacitance $C_{fd}$ of the floating diffusion region 108 is reduced. The total capacitance $C_{fd}$ of the floating diffusion region 108 is expressed as follows:

$$C_{fd}=C_d+C_1+C_2+C_g \quad (1)$$

In the above expression (1), $C_d$ represents the capacitance between the floating diffusion region 108 and the p-type well region 102, and $C_1$ represents the capacitance between the floating diffusion region 108 and the output gate electrode 106. Further, $C_2$ represents the capacitance between the floating diffusion region 108 and the reset gate electrode 111, and $C_g$ represents the capacitance between the floating diffusion region 108 and the output amplifying circuit 114.

In the exemplary conventional solid-state image sensor shown in FIG. 24, the capacitance $C_1$ between the floating diffusion region 108 and the output gate electrode 106 is reduced through the prescribed distance L provided between the floating diffusion region 108 and the output gate electrode 106, while it is conceivably difficult to sufficiently reduce the total capacitance $C_{fd}$ of the floating diffusion region 108 by simply reducing the total capacitance $C_{fd}$. Thus, it is difficult to sufficiently increase the voltage of the signal extracted from the floating diffusion region 108 to the output amplifying circuit 114, and hence it may disadvantageously be difficult to detect the signal extracted from the floating diffusion region 108 in the output amplifying circuit 114. Consequently, detection sensitivity for the output signal is disadvantageously reduced.

SUMMARY OF THE INVENTION

The present invention has been proposed in order to solve the aforementioned problem, and an object of the present invention is to provide a solid-state image sensor capable of improving detection sensitivity for an output signal.

In order to attain the aforementioned object, a solid-state image sensor according to an aspect of the present invention comprises a first gate electrode formed on a semiconductor substrate, a first impurity region formed on the semiconductor substrate at a first distance from the first gate electrode for receiving the signal charges and a second gate electrode formed at a second distance from the first impurity region for discharging unnecessary signal charges after extraction of a voltage signal from the first impurity region. The first distance between the first impurity region and the first gate electrode is larger than the second distance between the first impurity region and the second gate electrode.

In the solid-state image sensor according to this aspect, as hereinabove described, the first impurity region is formed at the first distance from the first gate electrode while the second gate electrode is formed at the second distance from the first impurity region so that both of the capacitance between the first impurity region and the first gate electrode and that between the second gate electrode and the first impurity region can be reduced, whereby the capacitances related to the first impurity region can be more reduced as compared with a case of providing a prescribed distance only between the first impurity region and the first gate electrode. Thus, the voltage of the signal extracted from the first impurity region can be so increased as to improve detection sensitivity for the output signal.

In the solid-state image sensor according to the aforementioned aspect, the solid-state image sensor preferably further comprises a charge storage part formed on a semiconductor substrate with a function for storing signal charges, while the first gate electrode preferably has a function for outputting the signal charges from the charge storage part, and the first impurity region preferably receives the signal charges output from the charge storage part. According to this structure, the solid-state image sensor can easily output the signal charges from the charge storage part with the first gate electrode, while feeding the output charges into the first impurity region. Further, reduction of the capacitance between the first impurity region and the first gate electrode can be increased beyond that of the capacitance between the first impurity region and the second gate electrode by rendering the first distance between the first impurity region and the first gate electrode larger than the second distance between the first impurity region and the second gate electrode also when the capacitance between the first impurity region and the first gate electrode is increased beyond that between the first impurity region and the second gate electrode due to the plane area of the charge storage part increased for ensuring the quantity of the signal charges stored in the charge storage part, whereby the capacitance between the first impurity region and the first gate electrode can be efficiently reduced.

In the solid-state image sensor according to the aforementioned aspect, the first distance between the first impurity region and the first gate electrode is preferably set to a value smaller than that forming a potential barrier on a region between the first impurity region and the first gate electrode, and the second distance between the first impurity region and the second gate electrode is preferably set to a value smaller than that forming a potential barrier on a region between the first impurity region and the second gate electrode. According to this structure, no potential barrier is formed on the region between the first impurity region and the first gate electrode despite the first distance provided between the first impurity region and the first gate electrode, whereby the first impurity region can receive the signal charges with no inhibition by a potential barrier. Thus, transfer efficiency for the signal charges to the first impurity region can be inhibited from reduction despite the first distance provided between the first impurity region and the first gate electrode. Further, the second distance between the first impurity region and the second gate electrode is set to the value smaller than that forming a potential barrier on the region between the first impurity region and the second gate electrode, whereby no potential barrier is formed on the region between the first impurity region and the second gate electrode despite the second distance provided between the first impurity region and the second gate electrode. Thus, the solid-state image sensor can discharge unnecessary signal charges from the first impurity region through the region between the first impurity region and the second gate electrode with no inhibition by a potential barrier. Therefore, the solid-state image sensor can sufficiently discharge unnecessary signal charges from the first impurity region despite the second distance provided between the first impurity region and the second gate electrode.

The solid-state image sensor according to the aforementioned aspect preferably further comprises a second impurity region formed on a partial region of the semiconductor substrate located between the first impurity region and the first gate electrode at a third distance from the first gate electrode, and the second impurity region preferably has an impurity concentration higher than the impurity concentration of the remaining region of the semiconductor substrate excluding the second impurity region located between the first impurity region and the first gate electrode and lower than the impurity concentration of the first impurity region. According to this structure, the second impurity region can reduce a channel potential in the partial region of the semiconductor substrate located between the first impurity region and the first gate electrode, thereby inhibiting the region located between the first impurity region and the first gate electrode from formation of a potential barrier. Thus, the first distance between the first impurity region and the first gate electrode can be more increased, thereby more reducing the capacitance between the first impurity region and the first gate electrode. Further, the second impurity region is formed to have the impurity concentration lower than that of the first impurity region at the third distance from the first gate electrode, whereby the capacitance between the second impurity region and the first gate electrode can be inhibited from increase despite the second impurity region formed on the region between the first impurity region and the first gate electrode. In this case, the second impurity region may be formed continuously with the first impurity region.

In the aforementioned structure provided with the third distance between the second impurity region and the first gate electrode, the third distance between the second impurity region and the first gate electrode is preferably set to a value smaller than that forming a potential barrier on a region between the second impurity region and the first gate electrode. According to this structure, no potential barrier is formed on the region between the second impurity region and the first gate electrode, whereby the first impurity region can receive the signal charges through the second impurity region with no inhibition by a potential barrier. Thus, transfer efficiency for the signal charges to the first impurity region can be inhibited from reduction.

In the aforementioned structure including the second impurity region, the length of the second impurity region in a direction along the transfer direction of the signal charges is preferably set to about half the first distance between the first impurity region and the first gate electrode. According to this structure, the second impurity region can be easily formed between the first impurity region and the first gate electrode at the third distance corresponding to about half the distance between the first impurity region and the first gate electrode.

The solid-state image sensor according to the aforementioned aspect preferably further comprises a third impurity region formed on the semiconductor substrate through a region located under the second gate electrode from the first impurity region for receiving the unnecessary signal charges discharged from the first impurity region, for discharging the unnecessary signal charges from the first impurity region to the third impurity region through the region located under the second gate electrode by bringing the second gate electrode into an ON-state after extracting the voltage signal from the first impurity region. According to this structure, the solid-state image sensor can easily discharge the unnecessary signal charges from the first impurity region to the third impurity region with the second gate electrode.

In this case, the solid-state image sensor preferably inputs a first signal for switching the second gate electrode between the ON-state and an OFF-state into the second gate electrode. According to this structure, the solid-state image sensor can control the unnecessary signal charges for discharging the same from the first impurity region to the third impurity region after extracting the voltage signal from the first impurity region by switching the second gate electrode to the ON-state with the first signal after extracting the voltage signal from the first impurity region.

In the aforementioned structure including the charge storage part, the charge storage part preferably includes a transfer channel storing and transferring the signal charges. According to this structure, the capacitances related to the first impurity region receiving the signal charges output from the transfer channel can be more reduced for increasing the voltage of the signal extracted from the first impurity region. Thus, the solid-state image sensor including the transfer channel can improve detection sensitivity for the output signal output from the transfer channel through the first impurity region. Also when the capacitance between the first impurity region and the first gate electrode is increased beyond that between the first impurity region and the second gate electrode due to the plane area of the transfer channel increased for ensuring the quantity of the signal charges stored in the transfer channel, reduction of the capacitance between the first impurity region and the first gate electrode can be increased beyond that of the capacitance between the first impurity region and the second gate electrode, whereby the capacitance between the first impurity region receiving the signal charges from the transfer channel and the first gate electrode can be efficiently reduced.

In this case, the solid-state image sensor preferably further comprises a plurality of stages of transfer gate electrodes formed on the transfer channel, for transferring the signal charges stored in the transfer channel by alternately applying two-phase transfer signals to the respective transfer gate electrodes. According to this structure, the solid-state image sensor can easily transfer the signal charges stored in the transfer channel through the plurality of stages of transfer gate electrodes.

In the aforementioned structure including the plurality of stages of transfer gate electrodes, the solid-state image sensor preferably further comprises a first output part for extracting out the signal charges transferred by the transfer channel, and the first output part preferably includes the first gate electrode provided adjacently to the final-stage transfer gate electrode for outputting the signal charges from the transfer channel corresponding to the final-stage transfer gate electrode, the first impurity region receiving the signal charges output from the transfer channel corresponding to the final-stage transfer gate electrode and a wire connected to the first impurity region for extracting the signal charges out from the first impurity region. According to this structure, the first output part can easily extract the signal charges from the transfer channel corresponding to the final-stage transfer gate electrode through the first impurity region.

In this case, the solid-state image sensor preferably further comprises an output amplifying part connected to the wire for amplifying the signal charges extracted from the first impurity region and converting the signal charges to the voltage signal. According to this structure, the output amplifying part can obtain the voltage signal by amplifying the signal charges extracted from the transfer channel through the first impurity region, whereby the solid-state image sensor can obtain a large voltage signal also when the signal charges from the transfer channel are small.

In the aforementioned structure including the first impurity region receiving the signal charges output from the transfer channel corresponding to the final-stage transfer gate electrode, the solid-state image sensor preferably applies a prescribed voltage for holding the first gate electrode in an ON-state to the first gate electrode. According to this structure, the solid-state image sensor can easily feed the signal charges from the transfer channel corresponding to the final-stage transfer gate electrode to the first impurity region through the region located under the ON-state first gate electrode.

In the aforementioned structure including the charge storage part, the charge storage part preferably includes a photoelectric conversion part generating the signal charges by photoelectric conversion and storing the signal charges. According to this structure, the capacitances related to the first impurity region receiving the signal charges output from the photoelectric conversion part can be reduced for increasing the voltage of the signal extracted from the first impurity region. Thus, the solid-state image sensor including the photoelectric conversion part can improve detection sensitivity for the output signal output from the photoelectric conversion part through the first impurity region. Also when the capacitance between the first impurity region and the first gate electrode is increased beyond that between the first impurity region and the second gate electrode due to the plane area of the photoelectric conversion part increased for ensuring the quantity of the signal charges stored in the photoelectric conversion part, reduction of the capacitance between the first impurity region and the first gate electrode can be increased beyond that of the capacitance between the first impurity region and the second gate electrode, whereby the capacitance between the first impurity region receiving the signal charges output from the photoelectric conversion part and the first gate electrode can be efficiently reduced.

In this case, the solid-state image sensor is preferably provided with a plurality of photoelectric conversion parts and preferably further comprises a second output part provided every photoelectric conversion part for extracting out the signal charges generated by the corresponding photoelectric conversion part, while the second output part preferably includes the first gate electrode provided adjacently to the photoelectric conversion part for outputting the signal charges from the photoelectric conversion part, the first impurity region receiving the signal charges output from the photoelectric conversion part and a wire connected to the first impurity region for extracting the signal charges out from the first impurity region. According to this structure, the second output part can easily extract the signal charges from the corresponding one of the plurality of photoelectric conversion parts through the first impurity region respectively.

In the aforementioned structure including the wire for extracting the signal charges, the solid-state image sensor preferably further comprises an output amplifying part connected to the wire for amplifying the signal charges extracted from the first impurity region and converting the signal charges to the voltage signal. According to this structure, the output amplifying part can obtain the voltage signal by amplifying the signal charges extracted from the photoelectric conversion part through the first impurity region, whereby the solid-state image sensor can obtain a large voltage signal also when the signal charges from the photoelectric conversion part are small.

In the aforementioned structure provided with the charge storage part including the photoelectric conversion part, the solid-state image sensor preferably brings the first gate electrode into an OFF-state when the photoelectric conversion part performs photoelectric conversion, while bringing the first gate electrode into an ON-state when the signal charges are transferred from the photoelectric conversion part to the first impurity region. According to this structure, the solid-state image sensor can inhibit the signal charges from being output through the region located under the OFF-state first gate electrode when the photoelectric conversion part performs photoelectric conversion while outputting the signal charges to the photoelectric conversion part through the region located under the ON-state first gate electrode when transferring the signal charges from the photoelectric conversion part to the first impurity region. Thus, the solid-state image sensor can easily store the signal charges in the photoelectric conversion part in photoelectric conversion while easily transferring the signal charges from the photoelectric conversion part to the first impurity region in transfer.

In this case, the solid-state image sensor preferably inputs a second signal for switching the first gate electrode between the ON-state and the OFF-state in the first gate electrode. According to this structure, the solid-state image sensor can easily bring the first gate electrode into the OFF state with the second signal when the photoelectric conversion part performs photoelectric conversion while easily bringing the first gate electrode into the ON-state with the second signal when transferring the signal charges from the photoelectric conversion part to the first impurity region.

In the aforementioned structure provided with the charge storage part including the photoelectric conversion part, the solid-state image sensor may further comprise a surface shielding layer formed on the surface of the photoelectric conversion part for suppressing depletion in the vicinity of the surface of the photoelectric conversion part.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a solid-state image sensor according to a first embodiment of the present invention is described with reference to FIGS. 1 and 2.

Figure 1:
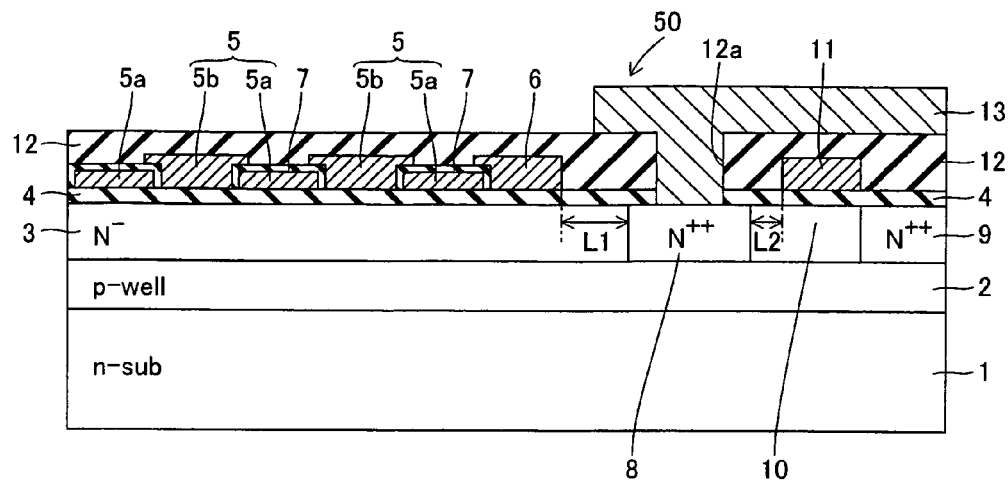
FIG. 1 is a sectional view showing the structure of a solid-state image sensor according to a first embodiment of the present invention.

The solid-state image sensor according to the first embodiment comprises an n-type silicon substrate 1, as shown in FIG. 1. This n-type silicon substrate 1 is an example of the "semiconductor substrate" in the present invention. A p-type well region 2 is formed with a depth of at least about 0.5 μm and not more than 4 μm from the upper surface of the n-type silicon substrate 1. An N⁻-type transfer channel region 3 having an impurity concentration of about $10^{16}$ cm$^{-3}$ is formed on the surface of the p-type well region 2. This transfer channel region 3 is an example of the "charge storage part" in the present invention. The transfer channel region 3 is formed up to a depth of about 0.5 μm from the upper surface of the n-type silicon substrate 1. The transfer channel region 3 has a function of storing and transferring signal charges. A plurality of stages of transfer gate electrodes 5 and an output gate electrode 6 are formed on the transfer channel region 3 at a prescribed distance through a gate insulating film 4 of SiO$_2$ having a thickness of about 50 nm. The output gate electrode 6 is an example of the "first gate electrode" in the present invention. The plurality of stages of transfer gate electrodes 5 and the output gate electrode 6 are made of polysilicon. The plurality of stages of transfer gate electrodes 5 are constituted of first- and second-layer transfer gate electrodes 5a and 5b having thicknesses of about 70 nm and about 300 nm respectively. The output gate electrode 6 has a thickness of about 300 nm.

The first- and second-layer transfer gate electrodes 5a and 5b are provided adjacently to each other through insulating films 7 of SiO$_2$. The output gate electrode 6 is provided adjacently to the final-stage first-layer transfer gate electrode 5a through a corresponding insulating film 7 of SiO$_2$. The insulating films 7 are formed to cover the upper and side surfaces of the first-layer transfer gate electrodes 5a respectively. The solid-state image sensor alternately applies two-phase clock pulse signals ΦH1 and ΦH2 to the transfer gate electrodes 5, as shown in FIG. 2. The clock pulse signals ΦH1 and ΦH2 are examples of the "transfer signal" in the present invention. The solid-state image sensor is so formed as to transfer signal charges stored in the transfer channel region 3 to a region located under the output gate electrode 6 by vertically moving channel potentials in potential wells formed in portions of the transfer channel region 3 located under the transfer gate electrodes 5 respectively with the two-phase clock pulse signals ΦH1 and ΦH2. The solid-state image sensor applies a prescribed DC voltage $V_{OG}$ to the output gate electrode 6 for holding the output gate electrode 6 in an ON-state. Thus, the solid-state image sensor transfers the signal charges transferred by the transfer gate electrode 5 to an N$^{++}$-type floating diffusion region 8 described later through the region of the transfer channel region 3 located under the output gate electrode 6.

The N$^{++}$-type floating diffusion region 8 having an impurity concentration of at least about $10^{20}$ cm$^{-3}$ is formed on the p-type well region 2 of the n-type silicon substrate 1 continuously with the transfer channel region 3. This floating diffusion region 8 is an example of the "first impurity region" in the present invention. The floating diffusion region 8 is formed to receive and store the signal charges output from the transfer channel region 3. An N$^{++}$-type drain region 9 having an impurity concentration of at least about $10^{20}$ cm$^{-3}$ is formed on the p-type well region 2 of the n-type silicon substrate 1 to hold an N$^-$-type channel region 10 between the same and the floating diffusion region 8. This drain region 9 is an example of the "third impurity region" in the present invention. The N$^-$-type channel region 10 has an impurity concentration of about $10^{16}$ cm$^{-3}$. A reset gate electrode 11 of polysilicon having a thickness of about 300 nm is formed on the channel region 10 through the gate insulating film 4. This reset gate electrode 11 is an example of the "second gate electrode" in the present invention. The solid-state image sensor inputs a reset pulse signal ΦR in the reset gate electrode 11 for switching the reset gate electrode 11 between ON- and OFF-states. The floating diffusion region 8, the drain region 9, the channel region 10, the gate insulating film 4 and the reset gate electrode 11 constitute a reset MOS transistor for discharging unnecessary signal charges after extraction of a voltage signal from the floating diffusion region 8. In other words, the solid-state image sensor inputs the reset pulse signal ΦR into the reset gate electrode 11 for bringing the reset gate electrode 11 into the ON-state after extracting the voltage signal from the floating diffusion region 8. Thus, the solid-state image sensor discharges unnecessary signal charges from the floating diffusion region 8 to the drain region 9 through the channel region 10 located under the ON-state reset gate electrode 11. The aforementioned reset pulse signal ΦR is an example of the "first signal" in the present invention.

According to the first embodiment, the floating diffusion region 8 is formed at distances L1 and L2 from the output gate electrode 6 and the reset gate electrode 11 respectively. The distances L1 and L2 are examples of the "first distance" and the "second distance" in the present invention respectively. Thus, the capacitance between the floating diffusion region 8 and the output gate electrode 6 and that between the floating diffusion region 8 and the reset gate electrode 11 are reduced. The distance L1 between the floating diffusion region 8 and the output gate electrode 6 is set larger than the distance L2 between the floating diffusion region 8 and the reset gate electrode 11.

Figure 2:
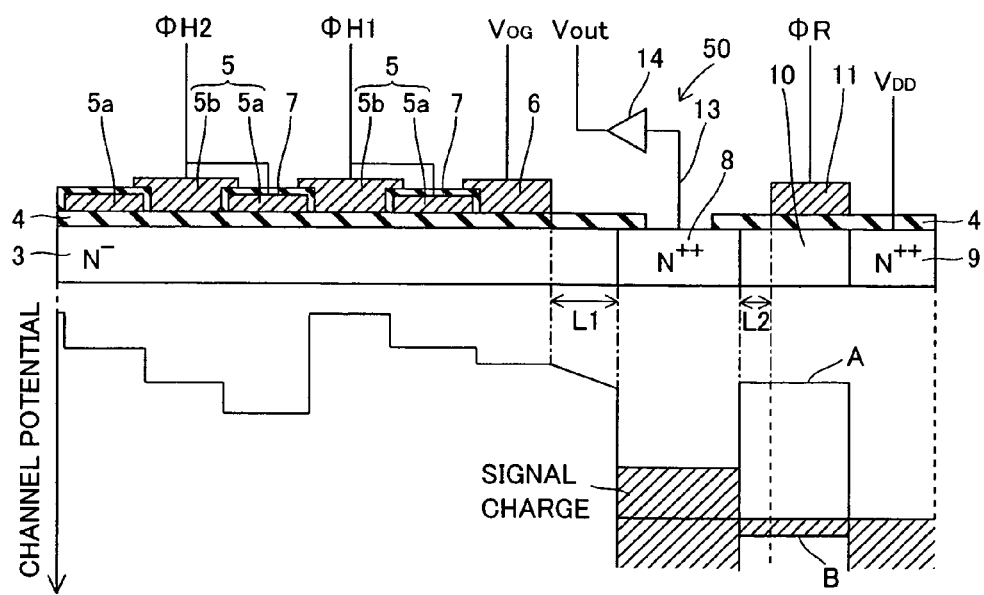
FIG. 2 is a potential diagram of the solid-state image sensor according to the first embodiment shown in FIG. 1.

According to the first embodiment, further, the distances L1 and L2 are set to values smaller than those forming potential barriers on the region between the floating diffusion region 8 and the output gate electrode 6 and that between the floating diffusion region 8 and the reset gate electrode 11 respectively, as shown in a potential diagram of FIG. 2. As shown in FIG. 1, an interlayer dielectric film 12 of SiO$_2$ is formed to cover the second-layer transfer gate electrodes 5b, the insulating films 7, the output gate electrode 6, the reset gate electrode 11 and the gate insulating film 4. A contact hole 12a reaching the surface of the floating diffusion region 8 is formed in regions of the interlayer dielectric film 12 and the gate insulating film 4 corresponding to the floating diffusion region 8 respectively. A wiring layer 13 of tungsten is formed to fill up the contact hole 12a while extending on the interlayer dielectric film 12. Thus, the wiring layer 13 is connected to the floating diffusion region 8, so that the solid-state image sensor can extract the signal charges from the floating diffusion region 8 through the wiring layer 13. The output gate electrode 6, the floating diffusion region 8 and the wiring layer 13 constitute an output part 50 for extracting the signal charges transferred by the transfer channel region 3. This output part 50 is an example of the "first output part" in the present invention.

The wiring layer 13 is connected to a source-follower output amplifying circuit 14 (see FIG. 2). This source-follower output amplifying circuit 14 is provided for extracting the signal charges stored in the floating diffusion region 8 through the wiring layer 13 while amplifying the extracted signal charges and converting the same to a voltage signal $V_{out}$. The solid-state image sensor outputs the converted voltage signal $V_{out}$ from the output amplifying circuit 14. The voltage $V_{outa}$ of the signal extracted from the floating diffusion region 8 to the output amplifying circuit 14 is expressed as follows:

$$V_{outa} = Q_s / C_{fda} \quad (2)$$

In the above expression (2), $Q_s$ represents the quantity of the signal charges stored in the floating diffusion region 8. $C_{fda}$ represents the total capacitance of the floating diffusion region 8, which is expressed as follows:

$$C_{fda} = C_{da} + C_{1a} + C_{2a} + C_{ga} \quad (3)$$

In this expression (3), $C_{da}$ represents the capacitance between the floating diffusion region 8 and the p-type well region 2, and $C_{1a}$ represents the capacitance between the floating diffusion region 8 and the output gate electrode 6. $C_{2a}$ represents the capacitance between the floating diffusion region 8 and the reset gate electrode 11, and $C_{ga}$ represents the capacitance between the floating diffusion region 8 and the output amplifying circuit 14.

According to the first embodiment, the floating diffusion region 8 is so formed at the distance L1 from the output gate electrode 6 that the capacitance $C_1$ between the floating diffusion region 8 and the output gate electrode 6 is reduced as compared with a case of providing no distance between the floating diffusion region 8 and the output gate electrode 6. Further, the floating diffusion region 8 is so formed at the distance L2 from the reset gate electrode 11 that the capacitance $C_2$ between the floating diffusion region 8 and the reset gate electrode 11 is reduced as compared with a case of providing no distance between the floating diffusion region 8 and the reset gate electrode 11. Thus, the total capacitance $C_{fda}$ of the floating diffusion region 8 is so reduced as to increase the voltage $V_{outa}$ of the signal extracted from the floating diffusion region 8 to the output amplifying circuit 14.

Operations of the solid-state image sensor according to the first embodiment are now described with reference to FIG. 2. The solid-state image sensor according to the first embodiment alternately applies the two-phase clock pulses ΦH1 and ΦH2 to the transfer gate electrodes 5 respectively. Thus, the solid-state image sensor transfers signal charges stored in portions of the transfer channel region 3 located under the transfer gate electrodes 5 to the region of the transfer channel region 3 located under the output gate electrode 6 by vertically moving the channel potentials in the potential wells formed in the portions of the transfer channel region 3 located under the transfer gate electrodes 5 respectively with the two-phase clock pulse signals ΦH1 and ΦH2. The solid-state image sensor applies the DC voltage $V_{OG}$ to the output gate electrode 6 for holding the output gate electrode 6 in the ON-state, thereby feeding the signal charges from the portion of the transfer channel region 3 located under the output gate electrode 6 into the floating diffusion region 8. The distance L1 between the output gate electrode 6 and the floating diffusion region 8 is set to the value smaller than that forming a potential barrier, whereby the signal charges flow from the portion of the transfer channel region 3 located under the output gate electrode 6 into the floating diffusion region 8 with no inhibition by a potential barrier. The floating diffusion region 8 stores the received signal charges. The solid-state image sensor extracts the signal charges stored in the floating diffusion region 8 to the output amplifying circuit 14 through the wiring layer 13. Thus, the output amplifying circuit 14 amplifies the signal charges and converts the same to the voltage signal $V_{out}$. The solid-state image sensor outputs the converted voltage signal $V_{out}$ from the output amplifying circuit 14.

After extracting the voltage signal $V_{out}$ from the floating diffusion region 8, the solid-state image sensor applies a high-level reset pulse signal ΦR to the reset gate electrode 11. Thus, the channel potential in the channel region 10 located under the reset gate electrode 11 is reduced from a level A to a level B in FIG. 2. Therefore, the signal charges stored in the floating diffusion region 8 are discharged to the drain region 9 through the channel region 10. According to the first embodiment, the distance L2 between the floating diffusion region 8 and the reset gate electrode 11 is set to the value smaller than that forming a potential barrier, whereby the solid-state image sensor discharges the signal charges from the floating diffusion region 8 to the drain region 9 with no inhibition by a potential barrier.

According to the first embodiment, as hereinabove described, the floating diffusion region 8 is formed at the distances L1 and L2 from the output gate electrode 6 and the reset gate electrode 11 respectively so that both of the capacitance between the floating diffusion region 8 and the output gate electrode 6 and that between the floating diffusion region 8 and the reset gate electrode 11 can be reduced, whereby the capacitances related to the floating diffusion region 8 can be more reduced as compared with a case of providing a prescribed distance only between the floating diffusion region 8 and the output gate electrode 6. Thus, the voltage of the signal extracted from the floating diffusion region 8 can be so increased that detection sensitivity for an output signal can be improved.

According to the first embodiment, the distance L1 between the floating diffusion region 8 and the output gate electrode 6 is set larger than the distance L2 between the floating diffusion region 8 and the reset gate electrode 11 so that reduction of the capacitance between the floating diffusion region 8 and the output gate electrode 6 can be increased beyond that of the capacitance between the floating diffusion region 8 and the reset gate electrode 11, whereby the capacitance between the floating diffusion region 8 and the output gate electrode 6 can be efficiently reduced also when the capacitance between the floating diffusion region 8 and the output gate electrode 6 is increased as compared with that between the floating diffusion region 8 and the reset gate electrode 11 due to the plane area of the transfer channel region 3 increased for ensuring the quantity of the signal charges stored in the transfer channel region 3.

According to the first embodiment, the distance L1 between the floating diffusion region 8 and the output gate electrode 6 is set to the value smaller than that forming a potential barrier on the region between the floating diffusion region 8 and the output gate electrode 6 so that no potential barrier is formed on the region between the floating diffusion region 8 and the output gate electrode 6, whereby the floating diffusion region 8 can receive the signal charges from the transfer channel region 3 with no inhibition by a potential barrier. Thus, transfer efficiency for the signal charges from the transfer channel region 3 to the floating diffusion region 8 can be inhibited from reduction.

According to the first embodiment, the distance L2 between the floating diffusion region 8 and the reset gate electrode 11 is set to the value smaller than that forming a potential barrier on the region between the floating diffusion region 8 and the reset gate electrode 11 so that no potential barrier is formed on the region between the floating diffusion region 8 and the reset gate electrode 11, whereby the solid-state image sensor can discharge unnecessary signal charges from the floating diffusion region 8 to the drain region 9 with no inhibition by a potential barrier. Thus, the solid-state image sensor can sufficiently discharge unnecessary signal charges from the floating diffusion region 8.

Figure 3:
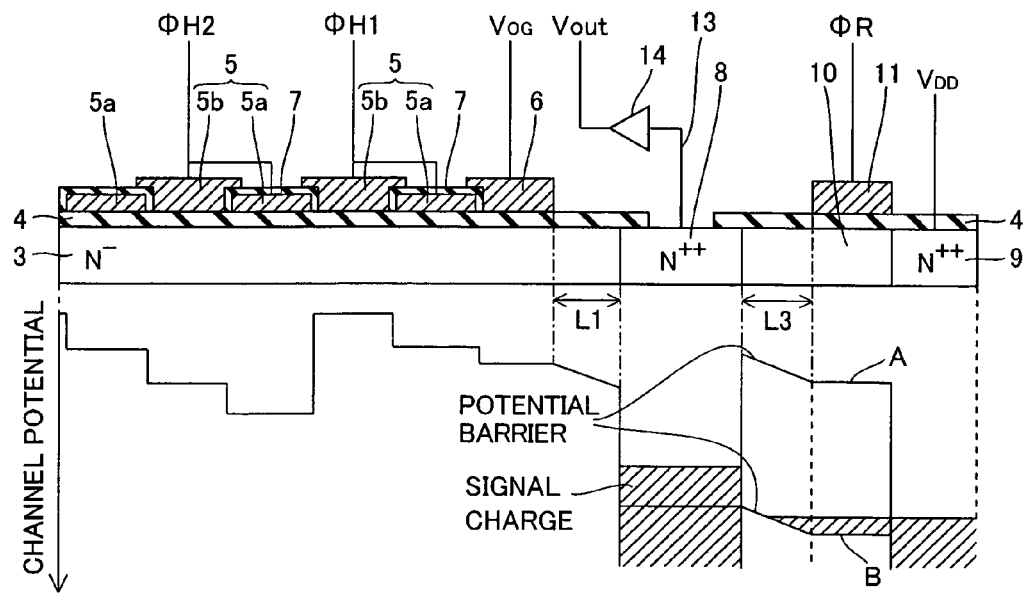
FIG. 3 is a comparative potential diagram for illustrating effects of the solid-state image sensor according to the first embodiment shown in FIG. 1.

When the distance between the floating diffusion region 8 and the reset gate electrode 11 is set to a value L3 exceeding that forming a potential barrier on the region between the floating diffusion region 8 and the reset gate electrode 11, a potential barrier is formed on the region between the floating diffusion region 8 and the reset gate electrode 11 as shown in FIG. 3. In this case, the potential barrier inhibits discharge of the signal charges from the floating diffusion region 8 to the drain region 9 despite the reduction of the channel potential in the channel region 10 located under the reset gate electrode 11 from the level A to the level B, and hence the solid-state image sensor cannot sufficiently discharge the signal charges.

A manufacturing process for the solid-state image sensor according to the first embodiment is now described with reference to FIGS. 1, 2 and 4 to 8.

Figure 4:
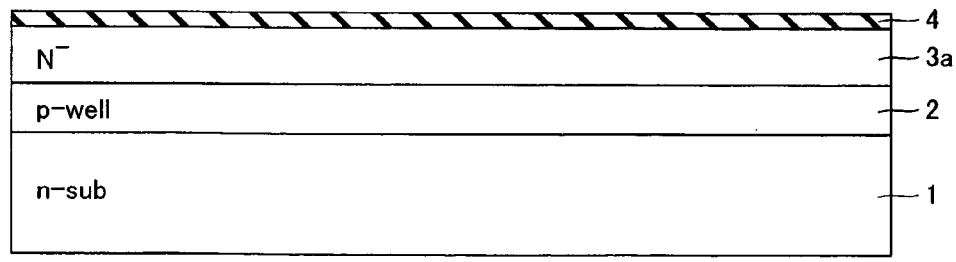
FIGS. 4 to 8 are sectional views for illustrating a manufacturing process for the solid-state image sensor according to the first embodiment of the present invention.

According to the first embodiment, the p-type well region 2 is formed up to the depth of about 4 μm from the upper surface of the n-type silicon substrate 1 by ion-implanting a p-type impurity into the n-type silicon substrate 1, as shown in FIG. 4. Thereafter phosphorus (P) is ion-implanted into the p-type well region 2 under conditions of implantation energy of about 50 keV and a dose of about $1 \times 10^{12}$ cm$^{-2}$. Thus, an N$^-$-type impurity region 3a having an impurity concentration of about $10^{16}$ cm$^{-3}$ is formed up to a depth of about 0.5 μm from the upper surface of the n-type silicon substrate 1. The gate insulating film 4 of SiO$_2$ having the thickness of about 50 nm is formed on the N$^-$-type impurity region 3a by CVD.

Figure 5:
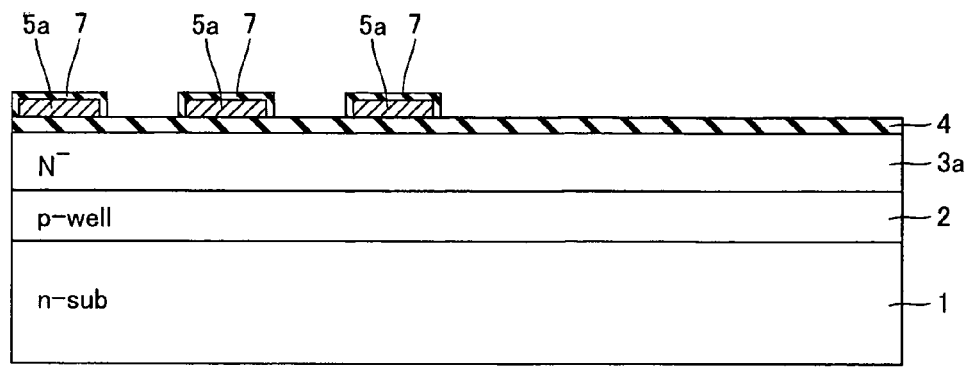

As shown in FIG. 5, the plurality of first-layer transfer gate electrodes 5a of polysilicon are formed on prescribed regions of the gate insulating film 4 at the prescribed distance by photolithography and etching. At this time, the first-layer transfer gate electrodes 5a are formed to have the thickness of about 70 nm. Thereafter the insulting films 7 of SiO$_2$ are formed by photolithography and etching, to cover the upper and side surfaces of the first-layer transfer gate electrodes 5a respectively.

Figure 6:
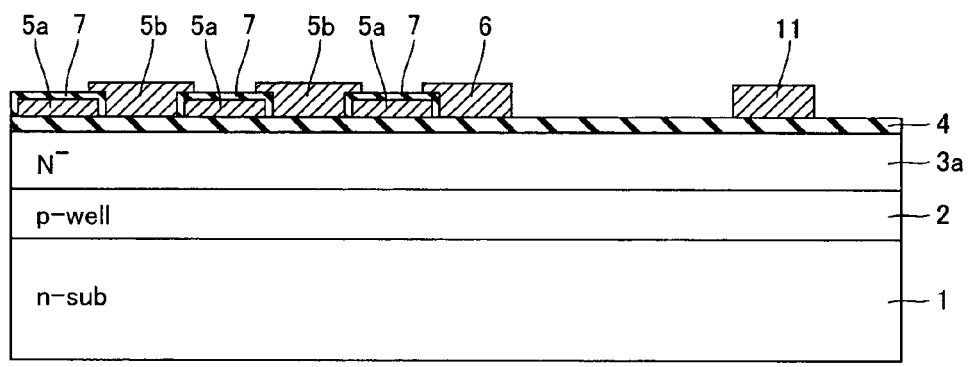

As shown in FIG. 6, the plurality of second-layer transfer gate electrodes 5b, the output gate electrode 6 and the reset gate electrode 11 are formed on the gate insulating film 4 at the prescribed distances by photolithography and etching. At this time, all of the second-layer transfer gate electrodes 5b, the output gate electrode 6 and the reset gate electrode 2 are prepared from polysilicon to have the thicknesses of about 300 nm respectively. The plurality of second-layer transfer gate electrodes 5b are formed on regions located between the first-layer transfer gate electrodes 5a adjacently to the first-layer transfer gate electrodes 5a through the insulating films 7 respectively. The output gate electrode 6 is formed adjacently to the final-stage first-layer transfer gate electrode 5a through the corresponding insulating film 7.

Figure 7:
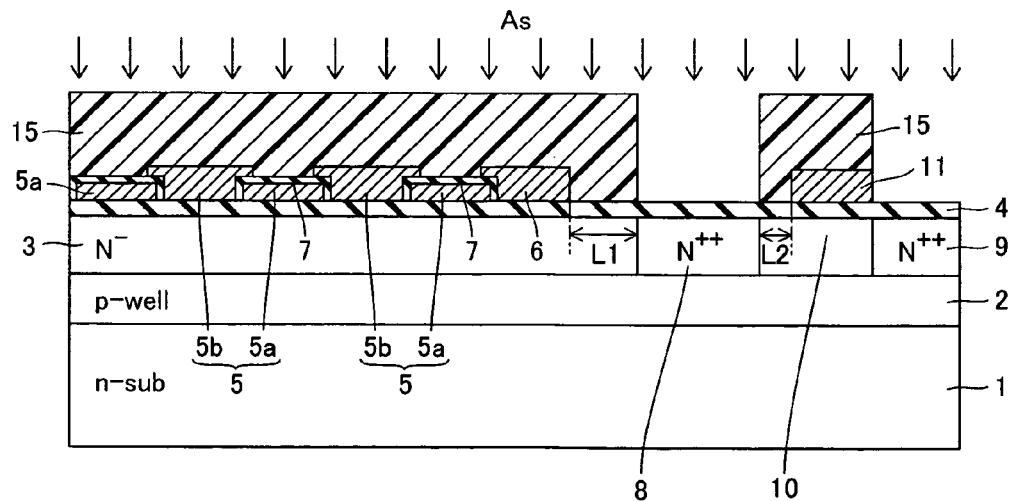

As shown in FIG. 7, resist films 15 are formed to cover regions excluding those formed with the floating diffusion region 8 and the drain region 9 respectively. According to the first embodiment, these resist films 15 are formed to cover regions of the gate insulating film 4 located between the output gate electrode 6 and the reset gate electrode 11 at the distances L1 and L2 from the output gate electrode 6 and the reset gate electrode 11 respectively. Thereafter arsenic (As) is ion-implanted into the n-type silicon substrate 1 through the masks of the resist films 15 under conditions of implantation energy of about 60 keV and a dose of about $3 \times 10^{15}$ cm$^{-2}$. Thus, the N$^{++}$-type floating diffusion region 8 having the impurity concentration of at least about $10^{20}$ cm$^{-3}$ is formed on the region of the n-type silicon substrate 1 corresponding to that between the output gate electrode 6 and the reset gate electrode 11. Further, the N$^{++}$-type drain region 9 having the impurity concentration of at least about $10^{20}$ cm$^{-3}$ is formed on the n-type silicon substrate 1 through the N$^-$-type channel region 10 provided between the same and the floating diffusion region 8. The floating diffusion region 8 is formed at the distances L1 and L2 from the output gate electrode 6 and the reset gate electrode 11 respectively. The transfer channel region 3 having the impurity concentration of about $10^{16}$ cm$^{-3}$ is formed on the region of the n-type silicon substrate 1 located under the transfer gate electrode 5 and the output gate electrode 6 continuously with the floating diffusion region 8. Thereafter the resist films 15 are removed.

Figure 8:
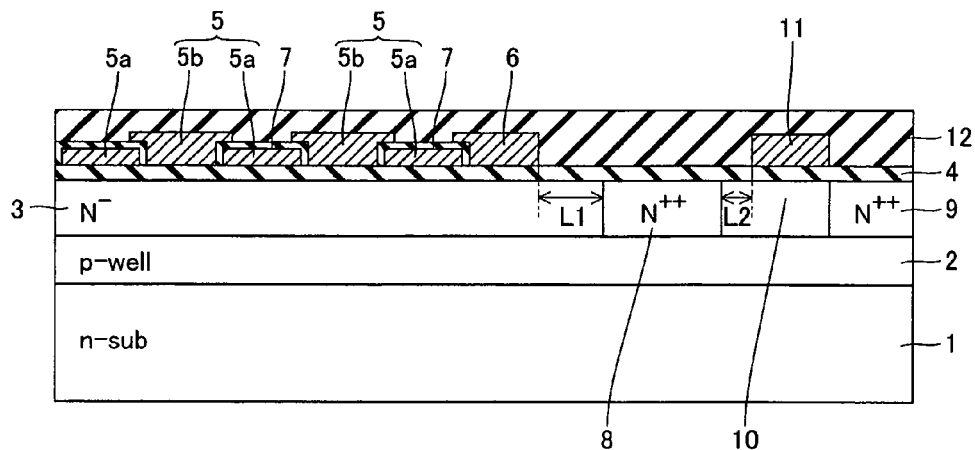

As shown in FIG. 8, the interlayer dielectric film 12 of SiO$_2$ is formed by CVD to cover the overall surface. Finally, the contact hole 12a reaching the surface of the floating diffusion region 8 is formed in the regions of the interlayer dielectric film 12 and the gate insulating film 4 corresponding to the floating diffusion region 8 respectively by photolithography and etching, as shown in FIG. 1. Thereafter the wiring layer 13 of tungsten is formed to fill up the contact hole 12a while extending on the surface of the interlayer dielectric film 12. The source-follower output amplifying circuit 14 (see FIG. 2) is connected to the wiring layer 13. The solid-state image sensor according to the first embodiment shown in FIG. 1 is formed in the aforementioned manner.

Second Embodiment

The structure of a solid-state image sensor according to a second embodiment of the present invention is now described with reference to FIGS. 9 and 10.

Figure 9:
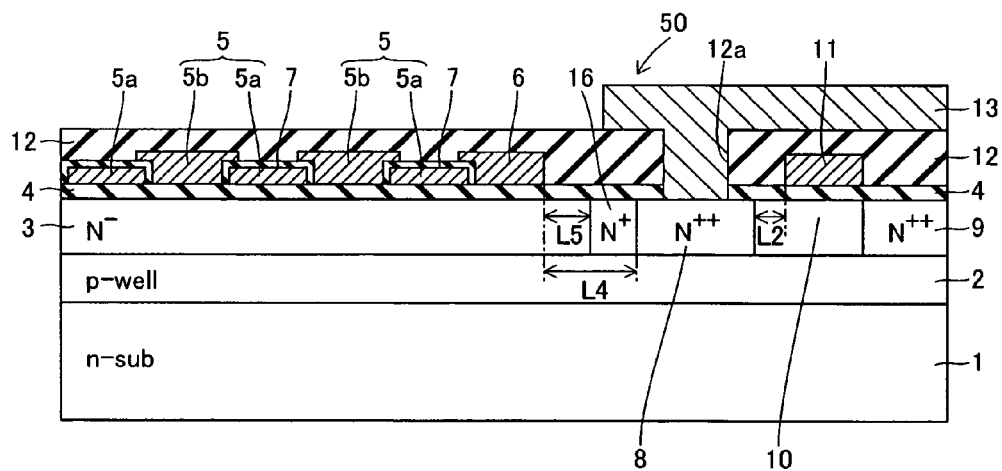
FIG. 9 is a sectional view showing the structure of a solid-state image sensor according to a second embodiment of the present invention.
Figure 10:
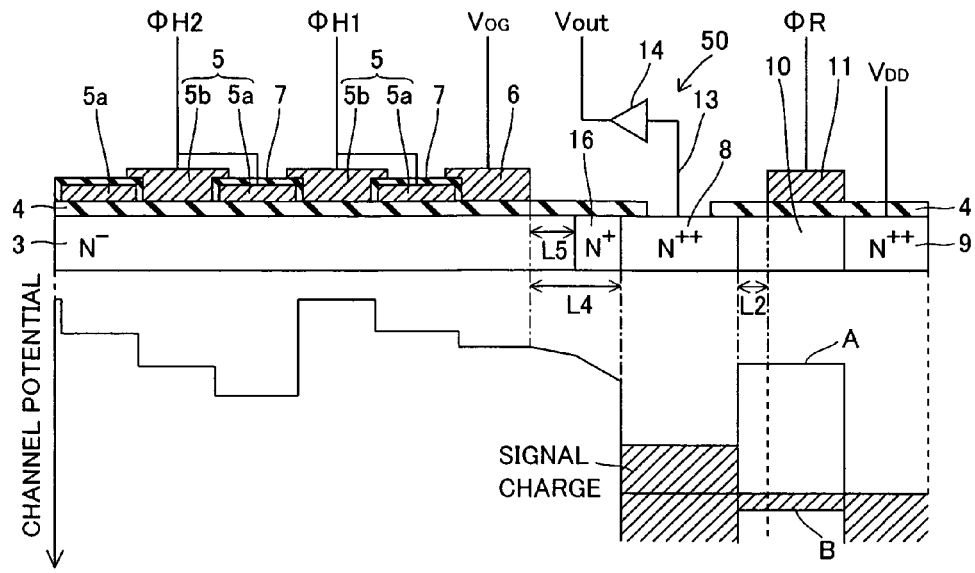
FIG. 10 is a potential diagram of the solid-state image sensor according to the second embodiment shown in FIG. 9.

In the solid-state image sensor according to the second embodiment shown in FIG. 9, an N$^+$-type impurity region 16 having an impurity concentration of about $10^{18}$ cm$^3$ is formed on a region of an n-type silicon substrate 1 located between an N$^{++}$-type floating diffusion region 8 and an output gate electrode 6, dissimilarly to the aforementioned solid-state image sensor according to the first embodiment. This N$^+$-type impurity region 16 is an example of the "second impurity region" in the present invention. In other words, the N$^+$-type impurity region 16 having the impurity concentration (about $10^{18}$ cm$^{-3}$) higher than the impurity concentration (about $10^{16}$ cm$^{-3}$) of an N$^-$-type transfer channel region 3 and lower than the impurity concentration (about $10^{20}$ cm$^{-3}$) of the N$^{++}$-type floating diffusion region 8 is formed on the region of the n-type silicon substrate 1 located between the floating diffusion region 8 and the output gate electrode 6. Thus, the channel potential is reduced in a portion corresponding to the N$^+$-type impurity region 16 between the floating diffusion region 8 and the output gate electrode 6, as shown in FIG. 10. The N$^+$-type impurity region 16 is formed continuously with the floating diffusion region 8. The width of the N$^+$-type impurity region 16 is set to about half the distance L4 between the floating diffusion region 8 and the output gate electrode 6. The N$^+$-type impurity region 16 is provided at a distance L5 from the output gate electrode 6. This distance L5 is an example of the "third distance" in the present invention. The distance L5 is set to a value smaller than that forming a potential barrier on the region between the N$^+$-type impurity region 16 and the output gate electrode 6. The remaining structure of the solid-state image sensor according to the second embodiment is similar to that of the aforementioned solid-state image sensor according to the first embodiment.

According to the second embodiment, as hereinabove described, the floating diffusion region 8 is formed at the distance L4 from the output gate electrode 6 and at a distance L2 from a reset gate electrode 11 so that both of the capacitance between the floating diffusion region 8 and the output gate electrode 6 and that between the floating diffusion region 8 and the reset gate electrode 11 can be reduced, whereby the capacitances related to the floating diffusion region 8 can be more reduced as compared with a case of providing a prescribed distance only between the floating diffusion region 8 and the output gate electrode 6. Thus, the voltage of a signal extracted from the floating diffusion region 8 can be increased for improving detection sensitivity for an output signal.

According to the second embodiment, further, the N$^+$-type impurity region 16 having the impurity concentration higher than that of the transfer channel region 3 and lower than that of the floating diffusion region 8 is formed on the region of the n-type silicon substrate 1 located between the floating diffusion region 8 and the output gate electrode 6 so that the channel potential of the region between the floating diffusion region 8 and the output gate electrode 6 can be reduced, whereby the region between the floating diffusion region 8 and the output gate electrode 6 can be inhibited from formation of a potential barrier. Thus, the distance L4 between the floating diffusion region 8 and the output gate electrode 6 can be more increased, thereby more reducing the capacitance between the floating diffusion region 8 and the output gate electrode 6. Further, the N$^+$-type impurity region 16 is formed to have the impurity concentration lower than that of the floating diffusion region 8 at the distance L5 from the output gate electrode 6, whereby the capacitance between the N$^+$-type impurity region 16 and the output gate electrode 6 can be inhibited from increase despite the N$^+$-type impurity region 16 formed on the region between the floating diffusion region 8 and the output gate electrode 6.

Figure 11:
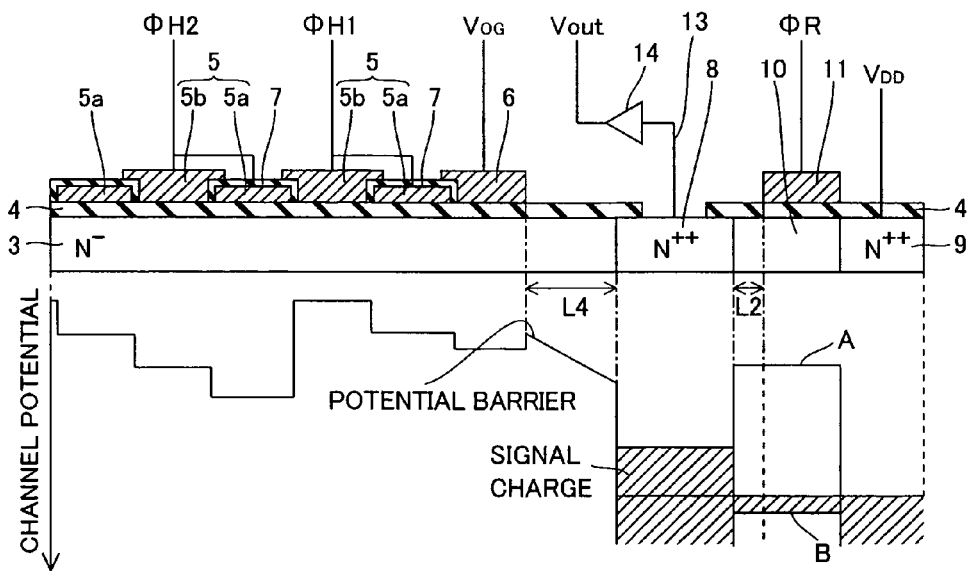
FIG. 11 is a comparative potential diagram for illustrating effects of the solid-state image sensor according to the second embodiment shown in FIG. 9.

If no N$^+$-type impurity region 16 is formed on the region between the floating diffusion region 8 and the output gate electrode 6 provided at the distance L4, a potential barrier may be formed on the region between the floating diffusion region 8 and the output gate electrode 6, as shown in FIG. 11. In this case, the potential barrier inhibits signal charges from flowing into the floating diffusion region 8 from the transfer channel region 3, and hence transfer efficiency for the signal charges is reduced.

According to the second embodiment, the distance L5 between the N$^+$-type impurity region 16 and the output gate electrode 6 is set to the value smaller than that forming a potential barrier on the region between the N$^+$-type impurity region 16 and the output gate electrode 6, whereby the solid-state image sensor can feed the signal charges from the transfer channel region 3 into the floating diffusion region 8 through the N$^+$-type impurity region 16 with no inhibition by a potential barrier. Thus, the solid-state image sensor can be inhibited from reduction of transfer efficiency for the signal charges from the transfer channel region 3 into the floating diffusion region 8.

A manufacturing process for the solid-state image sensor according to the second embodiment of the present invention is now described with reference to FIGS. 9, 12 and 13.

In the manufacturing process for the solid-state image sensor according to the second embodiment, a structure similar to that shown in FIG. 6 is formed through steps similar to those of the first embodiment shown in FIGS. 4 to 6. According to the second embodiment, resist films 17 are thereafter formed to cover regions excluding those formed with the floating diffusion region 8 (see FIG. 10), a drain region 9 and the N$^+$-type impurity region 16 respectively, as shown in FIG. 12. According to the second embodiment, the resist films 17 are formed to cover regions of the gate insulating film 4 located between the output gate electrode 6 and the reset gate electrode 11 at the distances L5 and L2 from the output gate electrode 6 and the reset gate electrode 11 respectively. Thereafter phosphorus (P) is ion-implanted into the n-type silicon substrate 1 through the masks of the resist films 17 under conditions of implantation energy of about 30 keV and a dose of about $2\times10^{12}$ cm$^{-2}$. Thus, an N$^+$-type impurity region 16a having an impurity concentration of about $10^{18}$ cm$^{-3}$ is formed on a region finally formed with the N$^{++}$-type floating diffusion region 8 (see FIG. 10) and the N$^+$-type impurity region 16, while another N$^+$-type impurity region 9a having an impurity concentration of about $10^{18}$ cm$^{-3}$ is formed on a region finally formed with the drain region 9 (see FIG. 10). The N$^+$-type impurity region 16a is formed at the distances L5 and L2 from the output gate electrode 6 and the reset gate electrode 11 respectively. The transfer channel region 3 having the impurity concentration of about $10^{16}$ cm$^{-3}$ is formed on the region of the n-type silicon substrate 1 located under the transfer gate electrode 5 and the output gate electrode 6 continuously with the N$^+$-type impurity region 16a. Thereafter the resist films 17 are removed.

Figure 12:
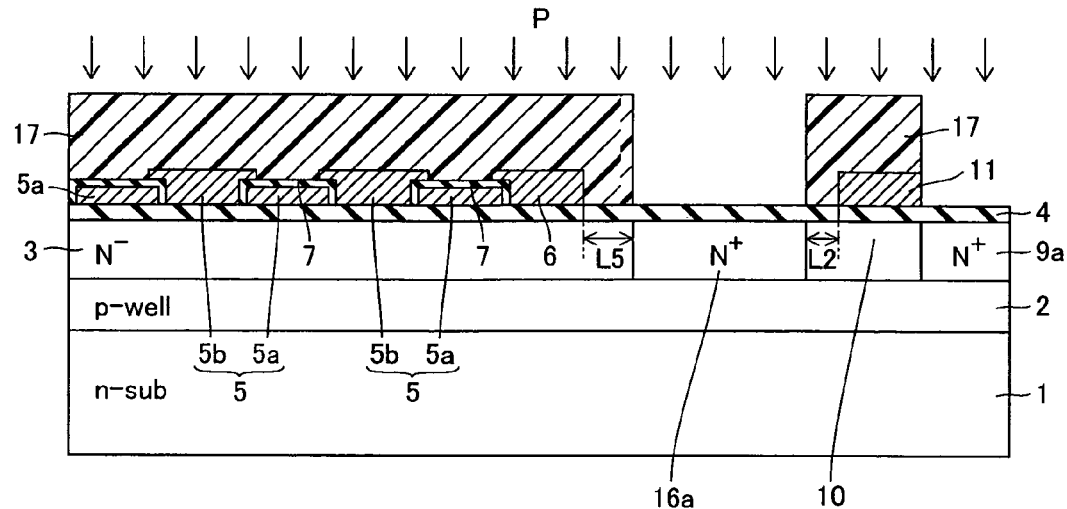
FIGS. 12 and 13 are sectional views for illustrating a manufacturing process for the solid-state image sensor according to the second embodiment of the present invention.
Figure 13:
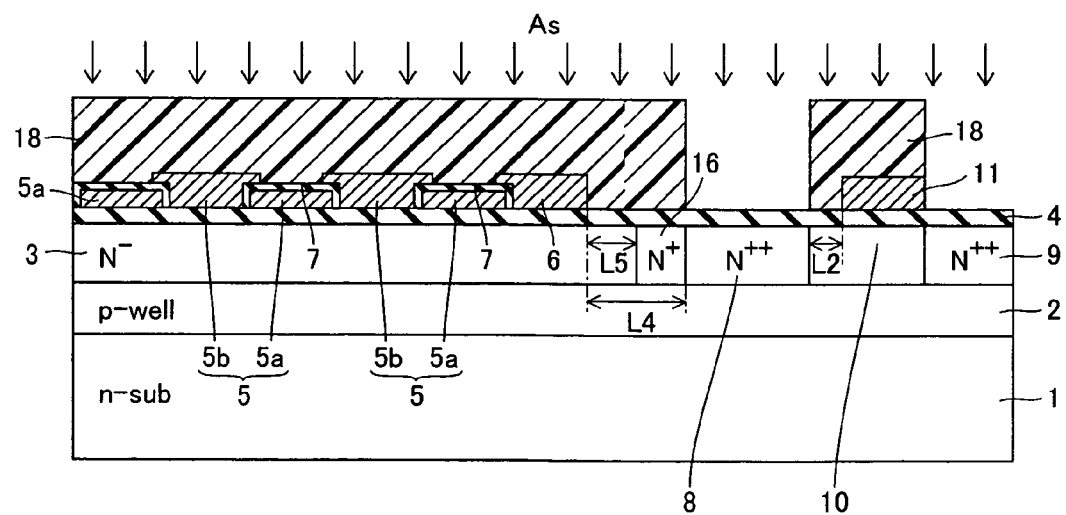

Then, other resist films 18 are formed to cover regions excluding those formed with the floating diffusion region 8 (see FIG. 10) and the drain region 9, as shown in FIG. 13. At this time, the distance L4 is set to about twice the distance L5. The resist films 18 are so formed as not to cover the region of the gate insulating film 4 corresponding to the impurity region 9a (see FIG. 12). Thereafter arsenic (As) is ion-implanted into the n-type silicon substrate 1 through the masks of the resist films 18 under conditions of implantation energy of about 60 keV and a dose of about $3\times10^{15}$ cm$^{-2}$. Thus, the N$^{++}$-type floating diffusion region 8 having the impurity concentration of at least about $10^{20}$ cm$^{-3}$ is formed in the N$^+$-type impurity region 16a (see FIG. 12) of the n-type silicon substrate 1. This floating diffusion region 8 is formed at the distances L4 and L2 from the output gate electrode 6 and the reset gate electrode 11 respectively. Further, the N$^+$-type impurity region 16 having the impurity concentration of about $10^{18}$ cm$^{-3}$ is formed continuously with the floating diffusion region 8. This N$^+$-type impurity region 16 is formed to have the width of about half the distance L4 between the floating diffusion region 8 and the output gate electrode 6. The N$^+$-type impurity region 16 is formed at the distance L5 from the output gate electrode 6. The N$^{++}$-type drain region 9 having the impurity concentration of at least about $10^{20}$ cm$^{-3}$ is formed on the n-type silicon substrate 1 to hold the N$^-$-type channel region 10 between the same and the floating diffusion region 8. According to the second embodiment, an interlayer dielectric film 12 and a wiring layer 13 are formed through steps similar to those of the aforementioned first embodiment, thereby forming the solid-state image sensor shown in FIG. 9.

A manufacturing process for a solid-state image sensor according to a modification of the second embodiment of the present invention is now described with reference to FIGS. 14 to 17. In the manufacturing process for the solid-state image sensor according to the modification of the second embodiment, an N$^{++}$-type floating diffusion region 8 is formed by contact implantation.

First, steps similar to those up to that shown in FIG. 12 are carried out similarly to the aforementioned second embodiment, for forming N$^+$-type impurity regions 16a and 9a.

Figure 14:
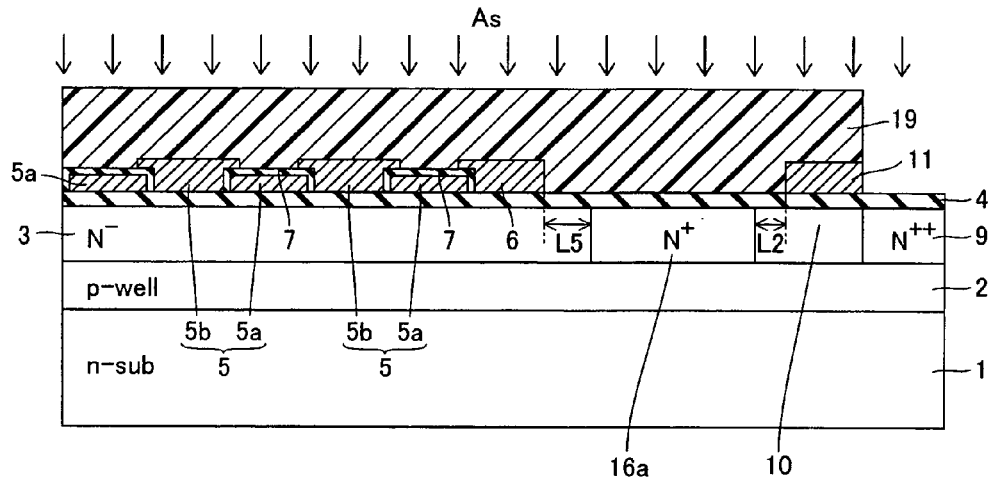
FIGS. 14 to 17 are sectional views for illustrating a manufacturing process for a solid-state image sensor according to a modification of the second embodiment of the present invention.

As shown in FIG. 14, a resist film 19 is formed to cover a region excluding that formed with a drain region 9. Thereafter arsenic (As) is ion-implanted into an n-type silicon substrate 1 through the mask of the resist film 19 under conditions of implantation energy of about 60 keV and a dose of about $3\times10^{15}$ cm$^{-2}$. Thus, an N$^{++}$-type drain region 9 having an impurity concentration of at least about $10^{20}$ cm$^{-3}$ is formed. Thereafter the resist film 19 is removed.

Figure 15:
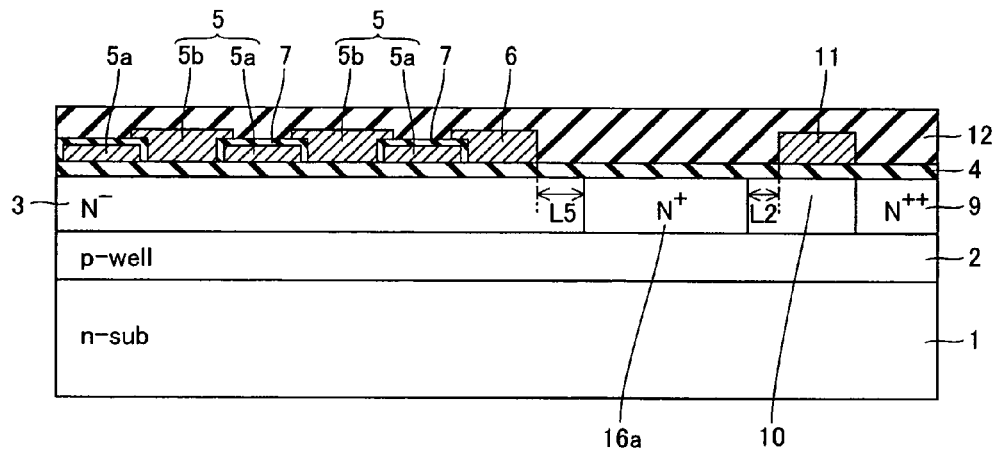
Figure 16:
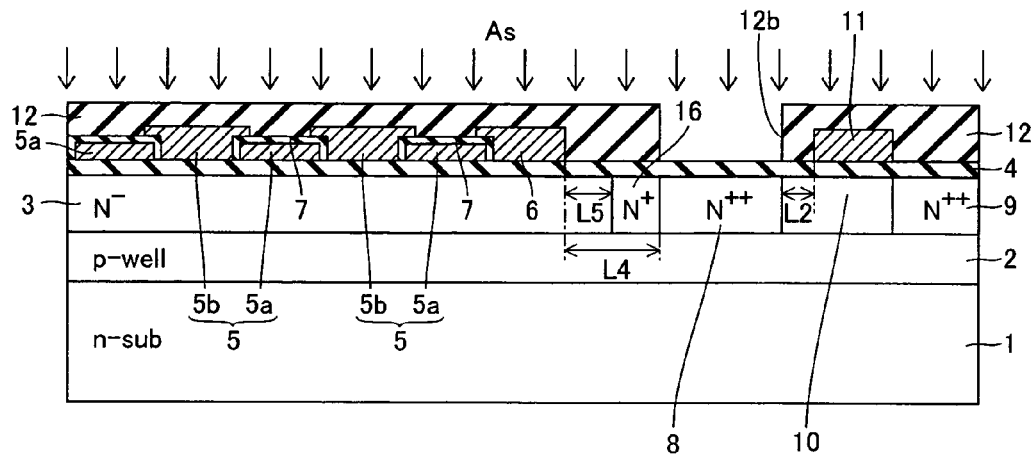

As shown in FIG. 15, an interlayer dielectric film 12 of SiO$_2$ is formed by CVD to cover the overall surface. As shown in FIG. 16, a contact hole 12b is formed in regions of the interlayer dielectric film 12 and a gate insulating film 4 corresponding to the N$^+$-type impurity region 16a respectively. This contact hole 12b is formed at distances L4 and L2 from an output gate electrode 6 and a reset gate electrode 11 respectively. Thereafter arsenic (As) is ion-implanted into the n-type silicon substrate 1 through the masks of the interlayer dielectric film 12 and the gate insulating film 4 under conditions of implantation energy of about 60 keV and a dose of about $3\times10^{15}$ cm$^{-2}$. Thus, arsenic (As) is introduced into the n-type silicon substrate 1 through the contact hole 12b. Therefore, the N$^{++}$-type floating diffusion region 8 having an impurity concentration of at least about 10$^{20}$ cm$^{-3}$ is formed on the n-type silicon substrate 1. This floating diffusion region 8 is formed at the distances L4 and L2 from the output gate electrode 6 and the reset gate electrode 11 respectively. Further, an N$^+$-type impurity region 16 is formed continuously with the floating diffusion region 8. This N$^+$-type impurity region 16 is formed at a distance L5 from the output gate electrode 6.

Figure 17:
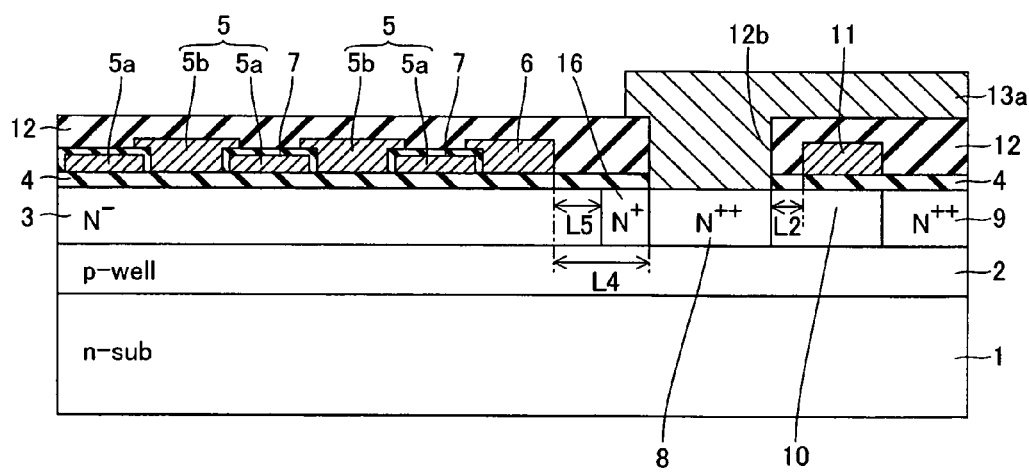

Finally, a wiring layer 13a of tungsten is formed to fill up the contact hole 12b while extending on the interlayer dielectric film 12, as shown in FIG. 17. The solid-state image sensor according to the modification of the second embodiment is formed in the aforementioned manner.

Third Embodiment

Figure 18:
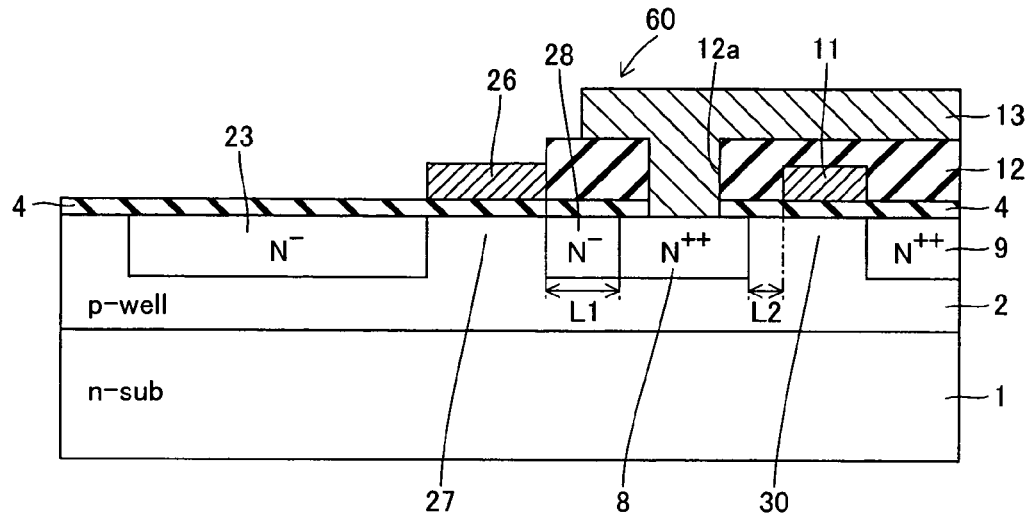
FIG. 18 is a sectional view showing the structure of a CMOS image sensor according to a third embodiment of the present invention.

The structure of a CMOS image sensor according to a third embodiment of the present invention is now described with reference to FIGS. 18 and 19.

In the CMOS image sensor according to the third embodiment, an N$^-$-type photodiode layer 23 is formed on the surface of a p-type well region 2 of an n-type silicon substrate 1 in place of the transfer channel region 3 shown in FIG. 1, dissimilarly to the aforementioned solid-state image sensor according to the first embodiment. This photodiode layer 23 is an example of the "photoelectric conversion part" or the "charge storage part" in the present invention. The photodiode layer 23 has a function of generating signal charges by receiving light and photoelectrically converting the same and storing the generated signal charges. A plurality of such photodiode layers 23 are formed on the surface of the p-type well region 2 in the form of a matrix. According to the third embodiment, an output part 60 is provided to every photodiode layer 23 for extracting the signal charges generated by the corresponding photodiode layer 23. This output part 60 is an example of the "second output part" in the present invention. The output part 60 is constituted of an output gate electrode 26, an N$^{++}$-type floating diffusion region 8 and a wiring layer 13. The output gate electrode 26 is an example of the "first gate electrode" in the present invention. The photodiode layer 23 is formed in a self-aligned manner with respect to the output gate electrode 26. In other words, the transverse positions of ends of the photodiode layer 23 and the output gate electrode 26 are aligned with each other. The p-type well region 2 is located under the output gate electrode 26, thereby forming a p-type channel region 27. The N$^{++}$-type floating diffusion region 8 is formed at a distance L1 from the channel region 27. An N$^-$-type impurity region 28 having the same impurity concentration as the photodiode layer 23 is formed on the region between the channel region 27 and the floating diffusion region 8.

Figure 19:
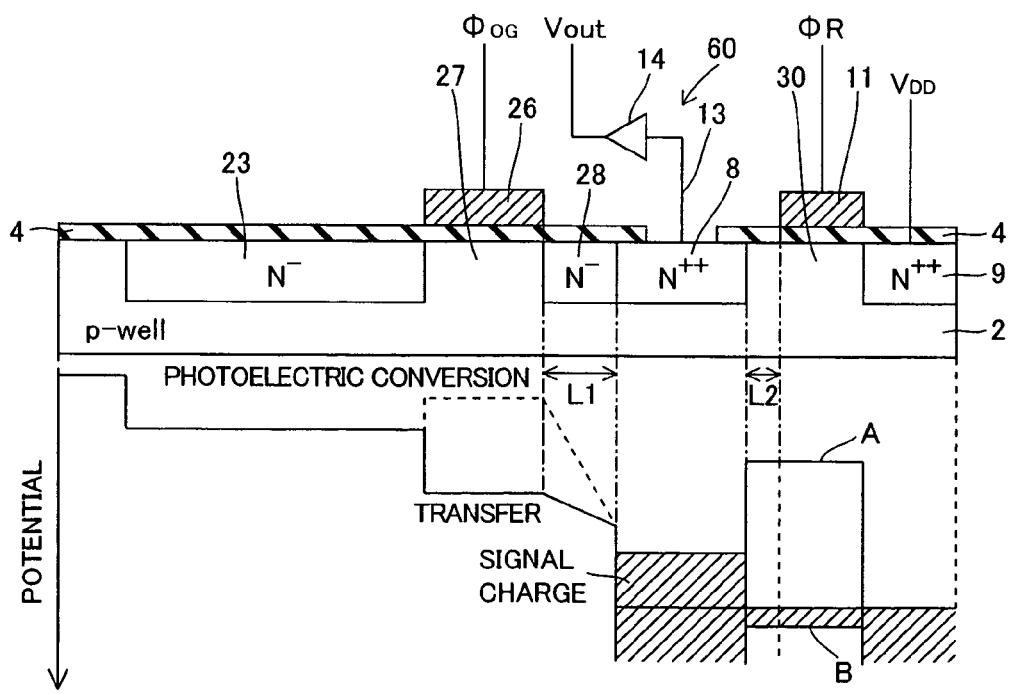
FIG. 19 is a potential diagram of the CMOS image sensor according to the third embodiment of the present invention.

According to the third embodiment, the CMOS image sensor inputs a signal $\Phi_{OG}$ in the output gate electrode 26 for switching the output gate electrode 26 between ON- and OFF-states, as shown in FIG. 19. This signal $\Phi_{OG}$ is an example of the "second signal" in the present invention. When the photodiode layer 23 performs photoelectric conversion, the CMOS image sensor brings the output gate electrode 26 into the OFF-state with the signal $\Phi_{OG}$, thereby increasing the potential of the region located under the output gate electrode 26. When the photodiode layer 23 transfers signal charges to the floating gate diffusion region 8, on the other hand, the CMOS image sensor switches the output gate electrode 26 to the ON-state, thereby reducing the potential of the region located under the output gate electrode 26. Thus, the CMOS image sensor forms a potential barrier on the region located under the output gate electrode 26 in photoelectric conversion as shown in FIG. 19, for storing signal charges in the photodiode layer 23. In transfer of signal charges, on the other hand, the CMOS image sensor transfers the signal charges stored in the photodiode layer 23 to the floating diffusion region 8 through the region located under the output gate electrode 26. According to the third embodiment, the p-type well region 2 is located under the reset gate electrode 11 thereby forming a p-type channel region 30.

The remaining structure of the CMOS image sensor according to the third embodiment is similar to that of the aforementioned solid-state image sensor according to the first embodiment.

According to the third embodiment, the CMOS image sensor including the photodiode layer 23 can improve detection sensitivity for an output signal output from the photodiode layer 23 through the floating diffusion region 8 while efficiently reducing the capacitance between the floating diffusion region 8 and the output gate electrode 26 due to the aforementioned structure, similarly to the aforementioned first embodiment.

Fourth Embodiment

The structure of a CMOS image sensor according to a fourth embodiment of the present invention is now described with reference to FIGS. 20 and 21.

Figure 20:
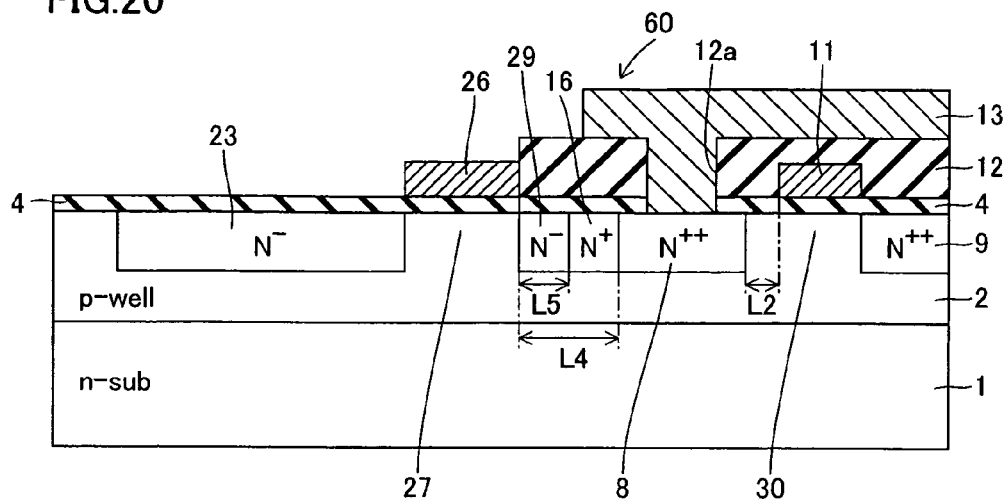
FIG. 20 is a sectional view showing the structure of a CMOS image sensor according to a fourth embodiment of the present invention.

In the CMOS image sensor according to the fourth embodiment, an N$^-$-type photodiode layer 23 is formed on the surface of a p-type well region 2 of an n-type silicon substrate 1 in place of the transfer channel region 3 shown in FIG. 9 in a solid-state image sensor similar to that according to the second embodiment, as shown in FIG. 20. The CMOS image sensor according to the fourth embodiment has the photodiode layer 23 and an output part 60 constituted of an output gate electrode 26, an N$^{++}$-type floating diffusion region 8 and a wiring layer 13 similarly to the aforementioned CMOS image sensor according to the third embodiment.

Figure 21:
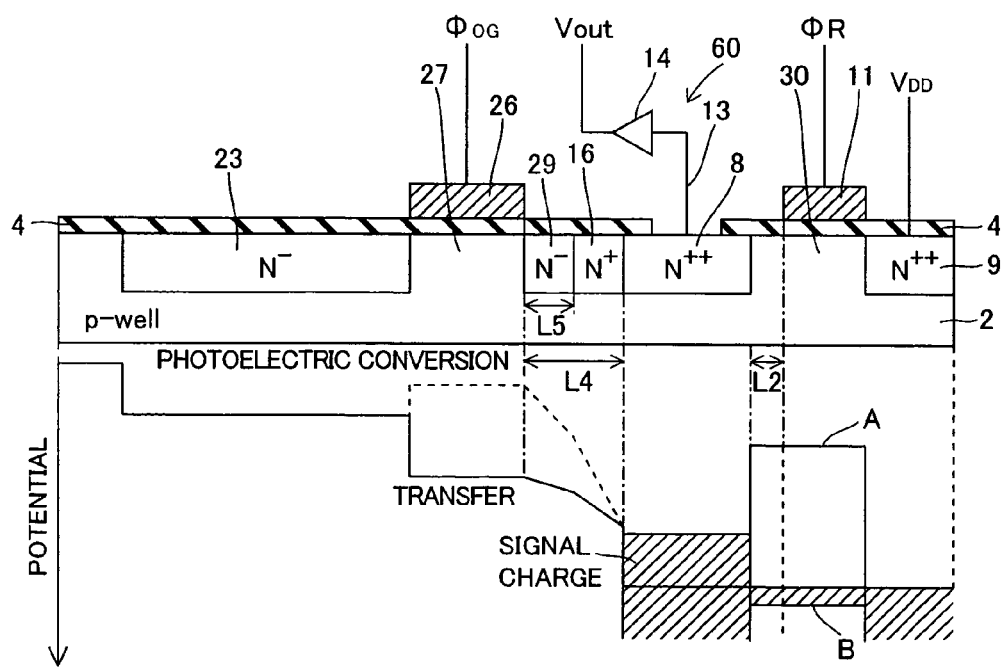
FIG. 21 is a potential diagram of the CMOS image sensor according to the fourth embodiment of the present invention.

According to the fourth embodiment, the CMOS image sensor inputs a signal $\Phi_{OG}$ in the output gate electrode 26 for switching the output gate electrode 26 between ON- and OFF-states as shown in FIG. 21, similarly to the aforementioned third embodiment. Thus, the CMOS image sensor forms a potential barrier on the region located under the OFF-state output gate electrode 26 thereby storing signal charges in the photodiode layer 23 in photoelectric conversion, while transferring the signal charges stored in the photodiode layer 23 to the floating diffusion region 8 through the region located under the output gate electrode 26 in transfer of signal charges. According to the fourth embodiment, the p-type well region 2 is located under the output gate electrode 26 and a reset gate electrode 11 thereby forming p-type channel regions 27 and 30 respectively, similarly to the aforementioned third embodiment. Further, an N$^-$-type impurity region 29 having the same impurity concentration as the photodiode layer 23 is formed on a region corresponding to a distance L5 between an N$^+$-type impurity region 16 formed continuously with the N$^{++}$-type floating diffusion region 8 and the p-type channel region 27 located under the output gate electrode 26.

The remaining structure of the CMOS image sensor according to the fourth embodiment is similar to that of the aforementioned solid-state image sensor according to the second embodiment.

According to the fourth embodiment, the CMOS image sensor including the photodiode layer 23 can improve detection sensitivity for an output signal output from the photodiode layer 23 through the floating diffusion region 8 while efficiently reducing the capacitance between the floating diffusion region 8 and the output gate electrode 26 due to the aforementioned structure, similarly to the aforementioned second embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the N$^+$-type impurity region is formed continuously with the floating diffusion region in each of the aforementioned second and fourth embodiments, the present invention is not restricted to this but the N$^+$-type impurity region may alternatively be formed at a prescribed distance from the floating diffusion region.

While the wiring layer is made of tungsten in each of the aforementioned first to fourth embodiments, the present invention is not restricted to this but the wiring layer may alternatively be made of a material other than tungsten. For example, the wiring layer may be made of another metallic material other than tungsten or polysilicon, for example.

Figure 22:
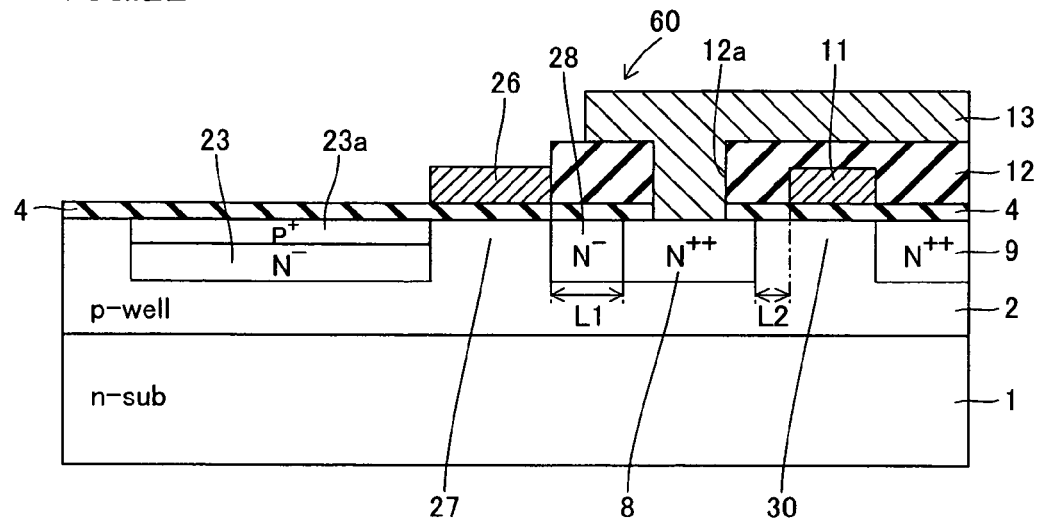
FIG. 22 is a sectional view showing the structure of a solid-state image sensor according to a modification of the third embodiment of the present invention.
Figure 23:
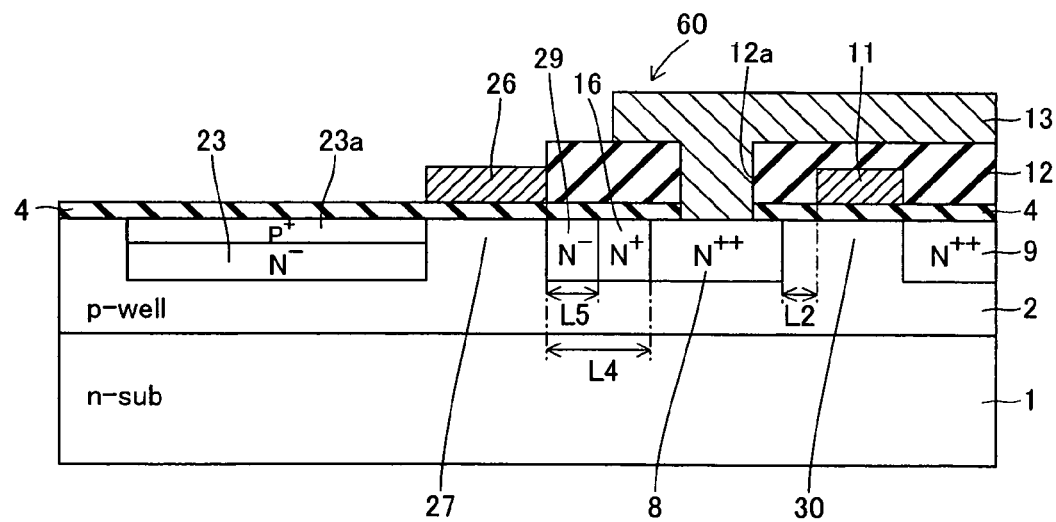
FIG. 23 is a sectional view showing the structure of a solid-state image sensor according to a modification of the fourth embodiment of the present invention.
Figure 24:
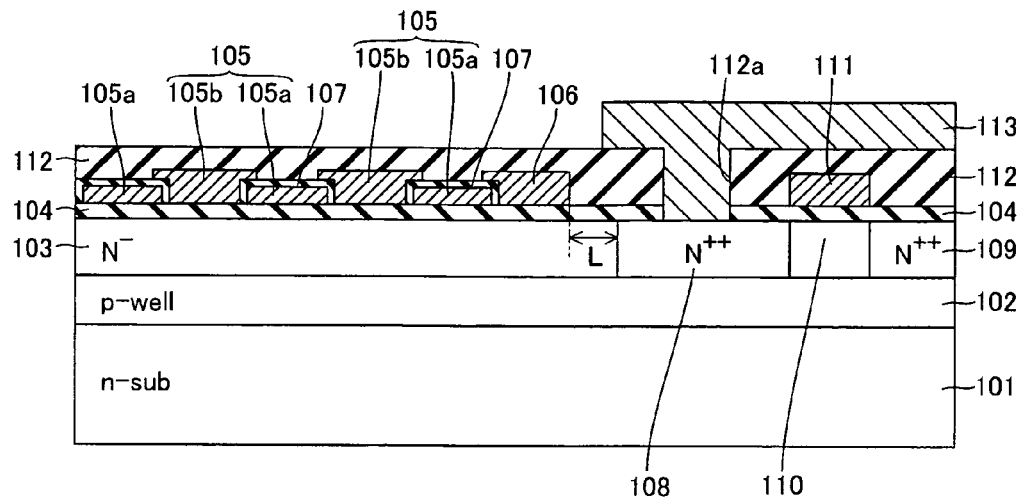
FIG. 24 is a sectional view showing the structure of an exemplary conventional solid-state image sensor.
Figure 25:
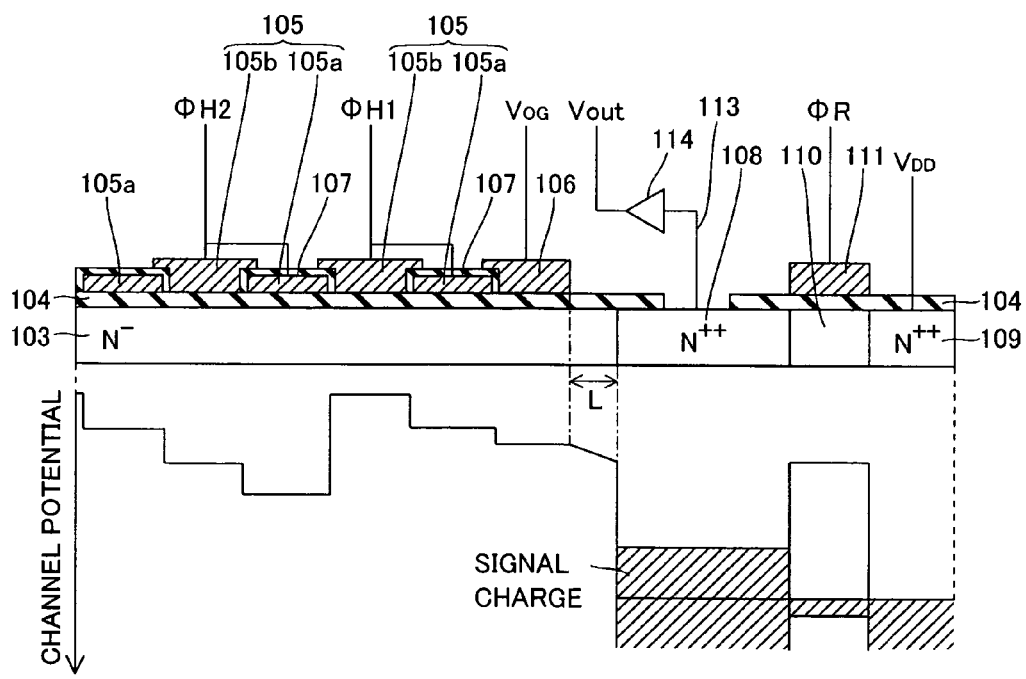
FIG. 25 is a potential diagram of the exemplary conventional solid-state image sensor shown in FIG. 24.

While the photodiode layer consists of only an N$^-$-type impurity region in each of the aforementioned third and fourth embodiments, the present invention is not restricted to this but a P$^+$-type surface shielding layer may alternatively be provided on the surface of the photodiode layer, in order to suppress depletion in the vicinity of the surface of the photodiode layer. For example, a P$^+$-type surface shielding layer 23a may be formed by ion-implanting a high-concentration p-type impurity into the surface of an N$^-$-type photodiode layer 23 as in a CMOS image sensor according to each of modifications of the third and fourth embodiments shown in FIGS. 22 and 23 respectively.

What is claimed is:

1. A solid-state image sensor comprising:
   an output gate electrode formed on a semiconductor substrate;
   a first impurity region formed on said semiconductor substrate at a first distance from said output gate electrode for receiving signal charges;
   a reset gate electrode formed at a second distance from said first impurity region for discharging unnecessary said signal charges after extraction of a voltage signal from said first impurity region; and
   a second impurity region having the same conductivity type as said first impurity region, said second impurity region being formed on a partial region of said semiconductor substrate located between said first impurity region and said output gate electrode at a third distance from said output gate electrode,
   wherein
   said second impurity region has an impurity concentration higher than the impurity concentration of the remaining region of said semiconductor substrate excluding said second impurity region located between said first impurity region and said output gate electrode, said remaining region has the same conductivity type as said second impurity region,
   said second impurity region has an average impurity concentration lower than an average impurity concentration of said first impurity region,
   said first distance between said first impurity region and said output gate electrode is larger than said second distance between said first impurity region and said reset gate electrode, and
   an insulating film is formed between said output gate electrode and said reset gate electrode, and said first impurity region.

2. The solid-state image sensor according to claim 1, further comprising a charge storage part formed on a semiconductor substrate with a function for storing signal charges, wherein
   said output gate electrode has a function for outputting said signal charges from said charge storage part, and
   said first impurity region receives said signal charges output from said charge storage part.

3. The solid-state image sensor according to claim 1, wherein
   said first distance between said first impurity region and said output gate electrode is set to a value smaller than that forming a potential barrier on a region between said first impurity region and said output gate electrode, and
   said second distance between said first impurity region and said reset gate electrode is set to a value smaller than that forming a potential barrier on a region between said first impurity region and said reset gate electrode.

4. The solid-state image sensor according to claim 1, wherein
   said second impurity region is formed continuously with said first impurity region.

5. The solid-state image sensor according to claim 1, wherein
   said third distance between said second impurity region and said output gate electrode is set to a value smaller than that forming a potential barrier on a region between said second impurity region and said output gate electrode.

6. The solid-state image sensor according to claim 1, wherein
   the length of said second impurity region in a direction along the transfer direction of said signal charges is set to about half said first distance between said first impurity region and said output gate electrode.

7. The solid-state image sensor according to claim 1, further comprising a third impurity region formed on said semiconductor substrate through a region located under said reset gate electrode from said first impurity region for receiving said unnecessary signal charges discharged from said first impurity region, for discharging said unnecessary signal charges from said first impurity region to said third impurity region through said region located under said reset gate electrode by bringing said reset gate electrode into an ON-state after extracting said voltage signal from said first impurity region.

8. The solid-state image sensor according to claim 7, inputting a first signal for switching said reset gate electrode between said ON-state and an OFF-state into said reset gate electrode.

9. The solid-state image sensor according to claim 2, wherein
   said charge storage part includes a transfer channel storing and transferring said signal charges.

10. The solid-state image sensor according to claim 9, further comprising a plurality of stages of transfer gate electrodes formed on said transfer channel, for transferring said signal charges stored in said transfer channel by alternately applying two-phase transfer signals to respective said transfer gate electrodes.

11. The solid-state image sensor according to claim 10, further comprising a first output part for extracting out said signal charges transferred by said transfer channel, wherein said first output part includes said output gate electrode provided adjacently to final-stage said transfer gate electrode for outputting said signal charges from said transfer channel corresponding to said final-stage transfer gate electrode, said first impurity region receiving said signal charges output from said transfer channel corresponding to said final-stage transfer gate electrode and a wire connected to said first impurity region for extracting said signal charges out from said first impurity region.

12. The solid-state image sensor according to claim 11, further comprising an output amplifying part connected to said wire for amplifying said signal charges extracted from said first impurity region and converting said signal charges to said voltage signal.

13. The solid-state image sensor according to claim 11, applying a prescribed voltage for holding said output gate electrode in an ON-state to said output gate electrode.

14. The solid-state image sensor according to claim 2, wherein
said charge storage part includes a photoelectric conversion part generating said signal charges by photoelectric conversion and storing said signal charges.

15. The solid-state image sensor according to claim 14, provided with a plurality of said photoelectric conversion parts and further comprising a second output part provided every said photoelectric conversion part for extracting out said signal charges generated by corresponding said photoelectric conversion part, wherein
said second output part includes said first gate electrode provided adjacently to said photoelectric conversion part for outputting said signal charges from said photoelectric conversion part, said first impurity region receiving said signal charges output from said photoelectric conversion part and a wire connected to said first impurity region for extracting said signal charges out from said first impurity region.

16. The solid-state image sensor according to claim 15, further comprising an output amplifying part connected to said wire for amplifying said signal charges extracted from said first impurity region and converting said signal charges to said voltage signal.

17. The solid-state image sensor according to claim 14, bringing said first gate electrode into an OFF-state when said photoelectric conversion part performs photoelectric conversion, while bringing said first gate electrode into an ON-state when said signal charges are transferred from said photoelectric conversion part to said first impurity region.

18. The solid-state image sensor according to claim 17, inputting a second signal for switching said first gate electrode between said ON-state and said OFF-state in said first gate electrode.

19. The solid-state image sensor according to claim 14, further comprising a surface shielding layer formed on the surface of said photoelectric conversion part for suppressing depletion in the vicinity of the surface of said photoelectric conversion part.

\* \* \* \* \*